(12) United States Patent
Houston

(10) Patent No.: US 7,534,668 B2
(45) Date of Patent: May 19, 2009

(54) METHOD OF FABRICATING ETCH-STOPPED SOI BACK-GATE CONTACT

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/417,627

(22) Filed: Apr. 17, 2003

(65) Prior Publication Data

US 2003/0173621 A1    Sep. 18, 2003

Related U.S. Application Data

(62) Division of application No. 10/008,690, filed on Nov. 8, 2001, now Pat. No. 6,576,957.

(51) Int. Cl.
*H01L 21/84* (2006.01)
*H01L 21/00* (2006.01)

(52) U.S. Cl. .................. 438/164; 438/149; 438/479; 438/740

(58) Field of Classification Search ............ 438/618, 438/624, 637, 640, 688, 738, 149, 311, 740, 438/479, 735, 737, 164; 257/750, 758, 760, 257/774, 436, 437
See application file for complete search history.

(56) References Cited

U.S. PATENT DOCUMENTS

| | | | | |
|---|---|---|---|---|
| 5,143,820 | A * | 9/1992 | Kotecha et al. | 430/314 |
| 5,362,667 | A * | 11/1994 | Linn et al. | 438/455 |
| 5,795,810 | A * | 8/1998 | Houston | 438/404 |
| 6,080,662 | A * | 6/2000 | Chen et al. | 438/637 |
| 6,096,612 | A | 8/2000 | Houston | |
| 6,140,024 | A * | 10/2000 | Misium et al. | 430/314 |
| 6,214,699 | B1 | 4/2001 | Joyner | |
| 6,340,844 | B1 * | 1/2002 | Sakamori | 257/774 |
| 6,426,305 | B1 * | 7/2002 | Chou et al. | 438/758 |
| 6,451,651 | B1 * | 9/2002 | Park et al. | 438/253 |
| 6,713,831 | B1 * | 3/2004 | Sadoughi et al. | 257/437 |

FOREIGN PATENT DOCUMENTS

JP         411067684 A  *  3/1999

* cited by examiner

*Primary Examiner*—Zandra Smith
*Assistant Examiner*—Khanh B Duong
(74) *Attorney, Agent, or Firm*—Frederick J. Telecky, Jr.; Wade J. Brady, III

(57) ABSTRACT

The buried oxide region has a layer added which etches selectively with respect to oxide, allowing the contacts to a gate or to a back gate to be created without overetching into the buried oxide region.

7 Claims, 3 Drawing Sheets

US 7,534,668 B2

METHOD OF FABRICATING ETCH-STOPPED SOI BACK-GATE CONTACT

This is a divisional application of Ser. No. 10/008,690 filed Nov. 8, 2001 now U.S. Pat. No. 6,576,957.

BACKGROUND AND SUMMARY OF THE INVENTION

The present application relates to semiconductor integrated circuits, and more particularly to contact formation in SOI structures.

BACKGROUND

Semiconductor-on-insulator (SOI) structures have grown in use as devices are scaled down in size. SOI technology allows structures to be fabricated in the buried oxide (BOX) to which electrical contact can be made from the top of the device.

Contacts are typically fabricated by etching through pre-metal dielectric (PMD) material down to the object to which connection is to be made. If the connection is to be made to a buried gate or other structure inside the BOX, etching must go through the PMD and part of the BOX. If connection is to be made to structure above the BOX, etching need only go through the PMD and would preferably be stopped before penetrating the BOX.

Alignment is critical in making connections, and lithographic patterning size and accuracy limits the robustness of the connections. Misalignment of etching can cause the etchant to go too deep, even reaching the substrate.

Prior attempts at alleviating the narrow margin of error on contact etches have dealt with using a PMD liner after the moat etch, which requires a change of etch chemistry to etch through this liner. Additionally, contacts which partially overhang the contacted structure are less robust because of decreased area of contact, which also creates higher contact resistance.

Etch-Stopping SOI Structure

The present application discloses an improved SOI structure for etching contacts to the moat. In one class of embodiments, the buried oxide comprises three layers: oxide, nitride, and oxide. The nitride layer acts as an etch stop relative to the oxide, since the two substances have different etching characteristics. This allows the contact to the moat to be made at the edge, or overlapping the edge. Normally, without adding etch stop layers and associated processing after moat etch, an overlapping contact etch would proceed past the moat into the buried oxide, and possibly through to the substrate. With an etch stop layer in the buried oxide, the contact etch can be made as close to the end of the moat as desired without fear of overetch, and without the complication of post-moat-etch etch stop layers. Variations on this idea are also presented, including (but not limited to) using fewer layers to create an etch stop, nitridating the buried oxide surface, and using an oxy-nitride instead of oxide as the buried insulating layer.

In another class of embodiments, a buried gate structure is fabricated in the buried oxide. This insulating region comprises oxide with a nitride layer, either below or adjacent to the buried gate.

Advantages of the disclosed methods and structures, in various embodiments, can include one or more of the following:

greater degree of freedom in contact alignment and/or design;

prevents overetch;

process simplicity relative to post-moat-etch etch stop techniques;

more robust contact, when contact overlaps into the isolation region;

option for etch stop for contacts to structures in the buried oxide.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
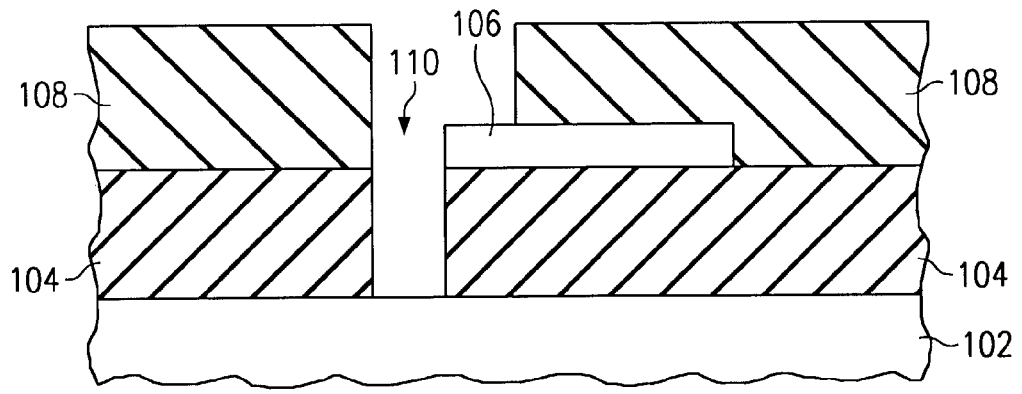
FIG. 1 shows a conventional SOI structure.

FIG. 1 shows a conventional semiconductor-on-insulator structure. A semiconductor substrate 102 (silicon in the preferred embodiment) has a layer of oxide 104 formed on it. A semiconductor material 106, preferably silicon, is formed on top of the oxide layer to create the moat, or the active area for creation of transistors or other integrated circuit features. This moat is typically isolated from other active areas by being covered with oxide 108 or a form of oxide (the pre-metal dielectric, or PMD), and has metallized contacts that lead to it through the PMD for electrical connection.

Etching the contact holes through the PMD to the moat is typically done using an etch process that is selective to etching oxides. The locations for the contacts are patterned and then etched down to the surface of the active material. Accuracy of the etch is critical in both placement and depth, since overetching outside the active area can allow the contact hole to be etched through the buried oxide to the underlying silicon substrate. FIG. 1 shows the moat, oxide layer, and silicon, and the contact etch hole 110. The etch hole is offset slightly from the moat, and has overetched deep into the oxide in this figure.

Figure 2:
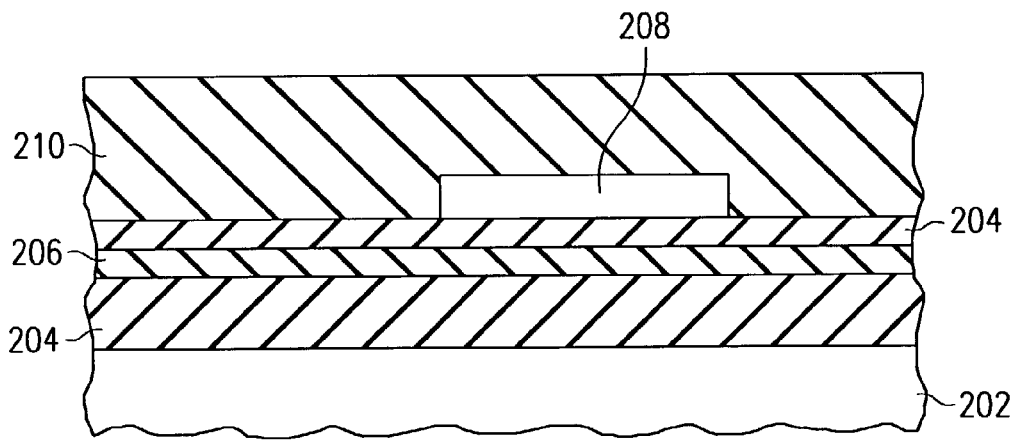
FIG. 2 shows an innovative SOI structure according to a preferred embodiment.

FIG. 2 shows an embodiment of the innovative SOI structure. The oxide layer 204 that is on top of the semiconductor 202 (preferably silicon) substrate has added to it a layer of SiN 206. In the embodiment shown in FIG. 2, this nitride layer has another layer of oxide over it 204. Atop the oxide is located the active region 208 which is covered with the PMD 210.

The nitride layer acts as an etch stop for the contact hole etch to the moat. It has different etch properties than the oxide and etches more slowly than an oxide when exposed to an oxide etch. Other materials that have etch selectivity with respect to oxide, such as amorphous silicon, may also be used as etch stop layers.

The etch stop layer allows the design of the contact to be placed near or overlapping the edge of the moat and allows a larger margin of overetch for the contact etch. Using the present innovations, etching outside the moat no longer poses a danger of damaging overetch because the nitride layer will stop any etchant from penetrating too deeply into the insulating region. Additionally, if the contact overlaps the edge of the moat, a greater surface area of active material may be contacted by the metallization lines, which may overlap and contact the moat on its end face as well as the top surface, compensating for the loss of top surface contact area, and thus forming a more robust connection. Note that this more robust contact would not be obtained with a post-moat-etch etch stop layer.

Figure 3:
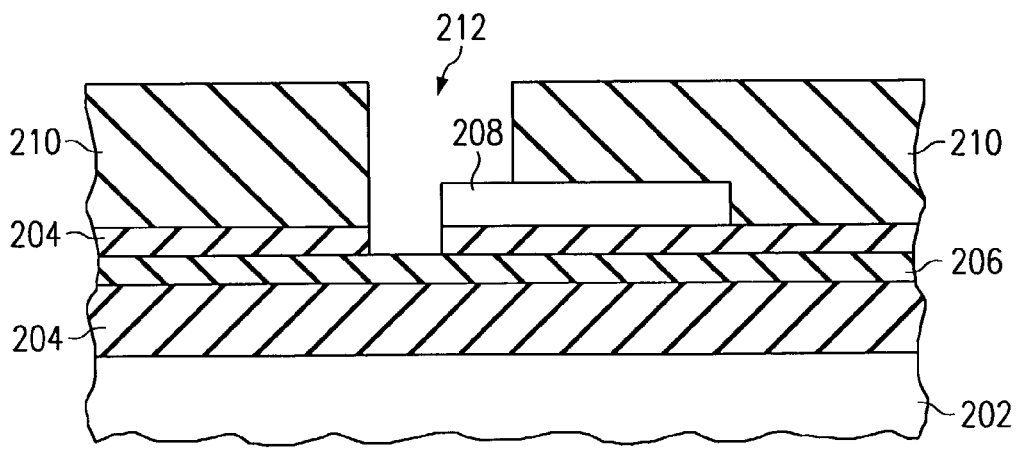
FIG. 3 shows an SOI structure during fabrication.

FIG. 3 shows the innovative structure of FIG. 2 after a contact hole 212 has been etched by an etching process. The etchant etches through the oxide to the moat (or the body of active material). The etch also etches through the oxide below the moat down to the nitride layer, where it is halted. Note that both the top surface and the end face of the active region are exposed for contact.

Figure 4:
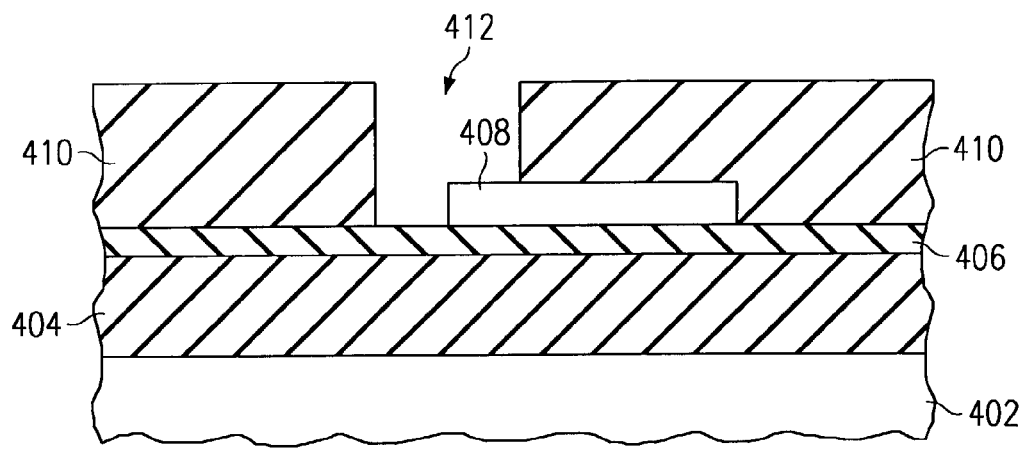
FIG. 4 shows a variation on the preferred embodiment.

FIG. 4 shows another variation on this innovative structure. As in previous embodiments, a semiconductor substrate 402 is covered with a layer of insulator 404, preferably oxide. In this embodiment, the nitride layer 406 is placed on top of the oxide layer beneath the moat 408 and there is no intervening oxide layer between the nitride etch stop layer and the active material of the moat. The etch is halted at the nitride layer.

Figure 5:
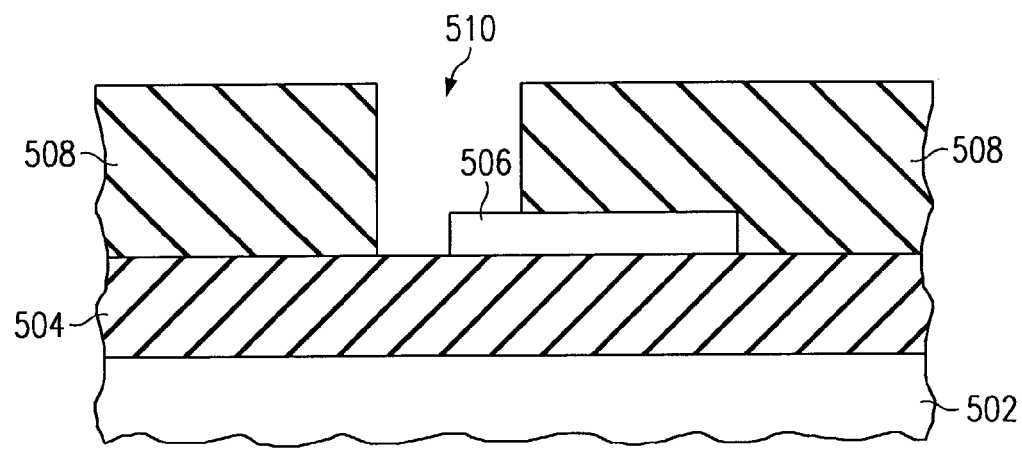
FIG. 5 shows a variation on the preferred embodiment.

An alternative embodiment is shown in FIG. 5. A semiconductor substrate 502 is covered with an oxy-nitride material 504 (or another suitable material with etch selectivity with respect to the PMD material). An active region 506 is positioned on the oxy-nitride layer 504 and is covered with the PMD 508 (preferably oxide if the BOX is actually made form oxy-nitride). The figure also shows the contact etch hole 510.

This embodiment uses an oxy-nitride material (oxide with small amounts of nitrogen) instead of the multi-layer stack as described above in previous embodiments. In this embodiment, the BOX is replaced with oxy-nitride, and the moat is formed on the surface. The oxide deposited on top of this structure may be etched, and the oxy-nitride will have sufficient etch selectivity with respect to oxide to act as a stop layer. The semiconductor substrate is covered with the oxy-nitride, which then has a silicon layer formed thereon. After patterning and etching the silicon, oxide is deposited. To form contacts to the moat, the oxide is etched. When the etchant reaches the oxy-nitride, it is halted without danger of etching too deeply. The oxy-nitride, having a coefficient of thermal expansion nearer to silicon than oxide, will also cause less stress on the structure during later processing.

Figure 6:
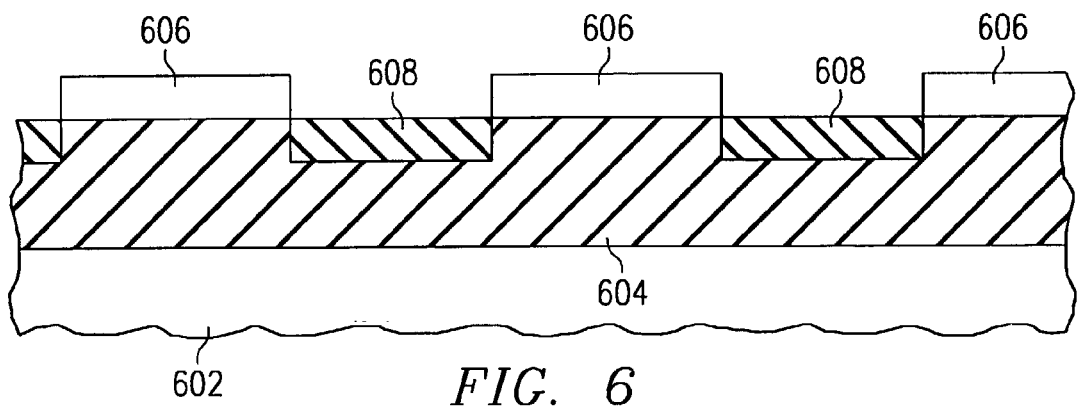
FIG. 6 shows a variation on the preferred embodiment.

In another embodiment, shown in FIG. 6, oxide 604 is formed on the surface of the substrate 602, then the active material (preferably silicon) is formed on the oxide. The silicon is then patterned and etched to form the islands of active material 606 for device fabrication. After etching this pattern, the oxide surface is nitridated. This is done by implantation, or by exposing the oxide to an ammonia ambient, for example. Nitrogen enters the oxide, forming sections of oxy-nitride 608 between the silicon islands 606. Then the PMD oxide is deposited over the structure. The oxide is etched to form contacts to the moats 606, and the oxy-nitride layers 608 adjacent to the moats 606 stop any etchant outside the moat from etching too deeply.

Figure 7:
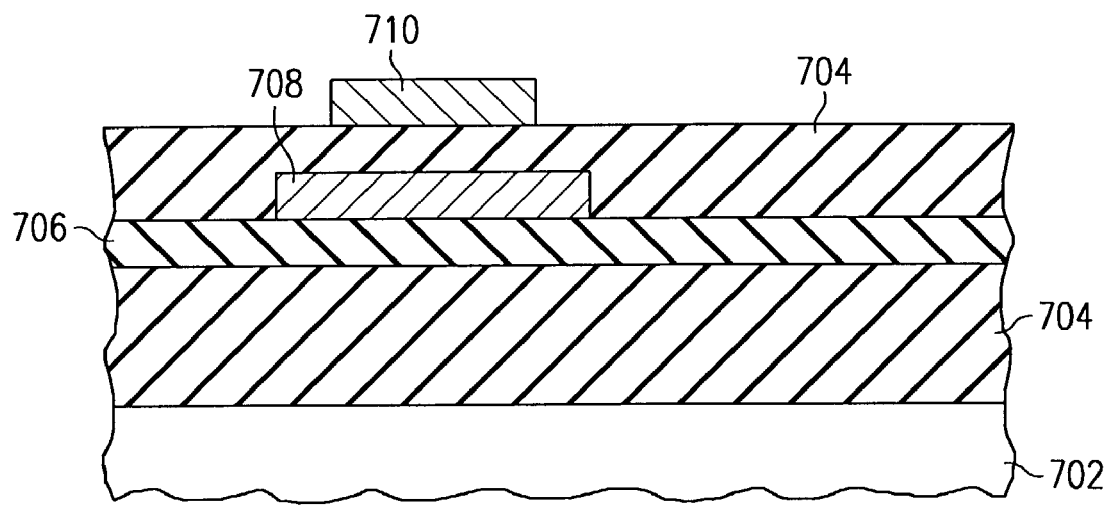
FIG. 7 shows another alternative embodiment having a buried gate structure.

FIG. 7 shows another embodiment of the present innovations. In this variation there is a buried structure within the BOX. In the preferred context this buried structure is a back gate and is made from polysilicon. The back gate is within the insulating region beneath the silicon moat (the gate on top of the insulating region) and extends beyond the umbrella, or perimeter, of the moat 710. Contact etches are typically done through the oxide to part of the back gate so that a metallized contact can be established with the buried gate structure.

In this figure, a semiconductor substrate 702 (preferably silicon) is covered with a region of insulating material. The region of insulating material comprises, in the preferred embodiment, two different materials 704, 706 with different etch characteristics. The back gate is also located in the insulating region. In the preferred embodiment, the insulating region comprises a layer of oxide 704, a layer of nitride 706, and another layer of oxide 704 in a stack. The back gate 708 is located on top of a layer of nitride 706 within the insulating region, surrounded on its other sides by oxide 704.

The nitride layer acts as an etch stop for the back gate contact etch. The contact etch is used to create a space for electrically connecting the back gate with metallization or other conducting material structures. If the pattern for the etch is displaced so that the etch extends past the edge of the back gate, the etchant will proceed through the easily etched oxide to the nitride layer, where it is halted. Of course other materials can be used for the etch stop layer, and nitride is only one possible material. Additionally, if the field oxide is replaced with another material, the etch stop layer will comprise a material that has different etch properties than whatever material was chosen in lieu of the oxide.

Figure 8:
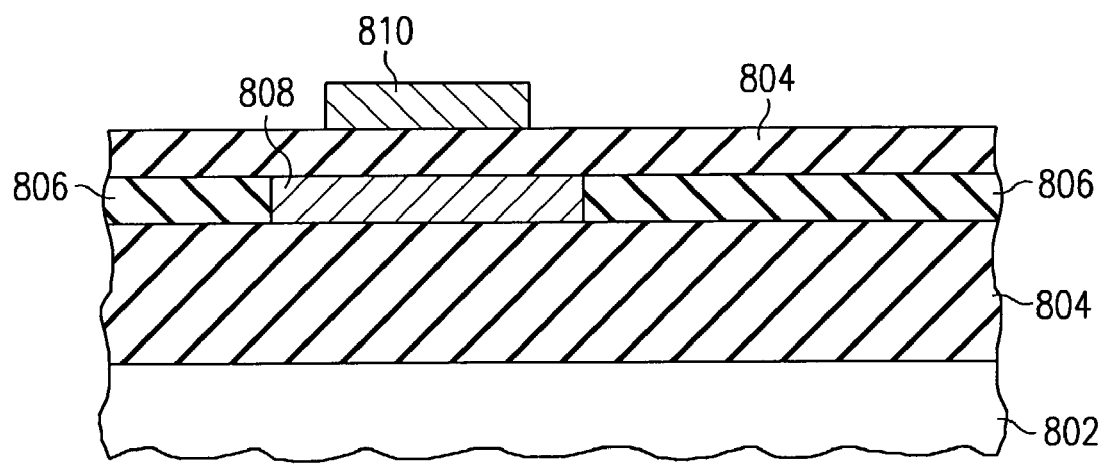
FIG. 8 shows a variation on the buried gate embodiment.

FIG. 8 shows another variation on this idea. The substrate of semiconductor material 802 is covered with an insulator 804 (preferably oxide). The back gate 808 is formed on the first insulator 804 with another insulator 806 (which has etch selectivity with respect to the other insulator 804) formed around the back gate 808. The second insulator is preferably nitride. Another layer of oxide 804 covers this structure as shown. The moat 810 is formed atop the oxide region. This entire structure is covered with a PMD (not shown).

In this example, the nitride 806 does not form a continuous layer within the BOX, but instead is located only adjacent to the back gate 808. This example shows the thickness of the nitride layer being equal to the thickness of the gate structure and flush with it, so that the back gate is surrounded on top and bottom by oxide and laterally bordered by nitride. Of course, a thinner or thicker layer of nitride can be used.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

SOI: Semiconductor-On-Insulator.

Moat: Region of active material.

Nitride: An insulator material, for example, $SiN_3$.

Oxide: An insulator material, for example, $SiO_2$.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the innovations in this application can be applied to SOI structures in which the layers of insulator and semiconductor are built up, such as with epitaxial lateral over-growth (ELO). Thus the "buried oxide" can be between layers of conducting material, all separated from the substrate.

Of course, the materials mentioned in the disclosed embodiments can be replaced with other materials that have the required relative etch selectivity.

Additional general background, which help to show the knowledge of those skilled in the art regarding variations and implementations of the disclosed inventions, may be found in the following documents, all of which are hereby incorporated by reference: Coburn, PLASMA ETCHING AND REACTIVE ION ETCHING (1982); HANDBOOK OF PLASMA PROCESSING TECHNOLOGY (ed. Rossnagel); PLASMA ETCHING (ed. Manos and Flamm 1989); PLASMA PROCESSING (ed. Dieleman et al. 1982); Schmitz, CVD OF TUNGSTEN AND TUNGSTEN SILICIDES FOR VLSI/ULSI APPLICATIONS (1992); METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTILEVEL METALLIZATION FOR INTEGRATED CIRCUITS (ed. Wilson et al. 1993); Rao, MULTILEVEL INTERCONNECT TECHNOLOGY (1993); CHEMICAL VAPOR DEPOSITION (ed. M. L. Hitchman 1993); and the semiannual conference proceedings of the Electrochemical Society on plasma processing.

What is claimed is:

1. A method of fabricating a silicon-on-insulator structure, comprising the steps of:
   forming a region of insulating material on a substrate, said region having at least a first layer, a second layer, and a third layer, wherein said region forms an insulator of said silicon-on-insulator structure;
   forming an active area of semiconductor material on said region of insulating material;
   concurrently exposing a portion of a top surface and side surface of said active area by an etch process;
   wherein said second layer has etch selectivity with respect to said first and third layers and acts as an etch stop for said etch process. thereby controlling overetching into said first layer.

2. The method of claim 1, wherein said substrate is a semiconductor substrate.

3. A method of fabricating a silicon-on-insulator structure, comprising the steps of:
   forming an insulating region on a substrate, said region having a first portion, a second portion, and an etch stop layer with etch selectivity with respect to said first portion and said second portion, wherein said etch stop layer is located between said first portion and said second portion;
   forming a buried structure of non-insulating material in said insulating region and covered by said insulating region;
   forming a body of semiconductor material on said insulating region, wherein said substrate, said insulating region, and said body of semiconductor material form said silicon-on-insulator structure; and
   etching at least a portion of said insulatinq region to concurrently expose a portion of a top surface and side surface of said buried structure;
   wherein said etch stop layer prevents said step of etching from reaching said substrate.

4. The method of claim 3, wherein said first portion and said second portion comprises oxide.

5. The method of claim 3, wherein said etch stop layer is nitride.

6. A method of fabricating a silicon-on-insulator structure, comprising the steps of:
   forming a region of insulating material on a substrate, said region having at least a first layer, a second layer formed on the first layer, and a third layer formed on the second layer, wherein said region forms an insulator of said silicon-on-insulator structure;
   forming an active area of semiconductor material on said region of insulating material;
   concurrently exposing a portion of a top surface and side surface of said active area by an etch process, wherein said etch process etches a portion of said third layer stopping on said second layer preventing overetching into at least said first layer, wherein said second layer has etch selectivity with respect to said first and third layers.

7. A method of fabricating a silicon-on-insulator structure, comprising the steps of:
   forming an insulator of the silicon-on-insulator structure on a substrate, said insulator having a first portion, a second portion, and an etch stop layer with etch selectivity with respect to said first portion and said second portion, wherein said etch stop layer is located between said first portion and said second portion;
   forming a buried structure of non-insulating material in said insulator and covered by said insulator;
   forming a body of semiconductor material on said insulator, wherein said substrate, said insulator, and said body of semiconductor material form said silicon-on-insulator structure;
   etching at least a portion of said insulator to concurrently expose a portion of a top surface and side surface of said buried structure;
   wherein said etch stop layer prevents said step of etching from reaching said substrate.

* * * * *